(12) United States Patent
Aritome

(10) Patent No.: US 8,120,954 B2
(45) Date of Patent: *Feb. 21, 2012

(54) METHOD, APPARATUS, AND SYSTEM FOR ERASING MEMORY

(75) Inventor: Seiichi Aritome, Hsinchu County (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/833,562

(22) Filed: Jul. 9, 2010

(65) Prior Publication Data

US 2010/0271877 A1 Oct. 28, 2010

Related U.S. Application Data

(63) Continuation of application No. 11/950,609, filed on Dec. 5, 2007, now Pat. No. 7,755,940.

(51) Int. Cl.
*G11C 16/04* (2006.01)

(52) U.S. Cl. ......... 365/185.03; 365/185.11; 365/185.19; 365/185.22

(58) Field of Classification Search ............. 365/185.03, 365/185.11, 185.19, 185.22
See application file for complete search history.

(56) References Cited

U.S. PATENT DOCUMENTS

| | | | |
|---|---|---|---|
| 6,483,752 B2 | 11/2002 | Hirano | |
| 6,654,292 B2 * | 11/2003 | Keays | 365/185.33 |
| 6,657,891 B1 * | 12/2003 | Shibata et al. | 365/185.03 |
| 7,272,050 B2 | 9/2007 | Han et al. | |
| 7,539,066 B2 * | 5/2009 | Aritome | 365/185.29 |
| 7,755,940 B2 * | 7/2010 | Aritome | 365/185.03 |
| 2006/0262606 A1 | 11/2006 | Aritome | |
| 2009/0147572 A1 | 6/2009 | Aritome | |

* cited by examiner

*Primary Examiner* — Pho M Luu
(74) *Attorney, Agent, or Firm* — Schwegman, Lundberg & Woessner, P.A.

(57) ABSTRACT

Methods, apparatus, and systems may operate to perform a pre-programming operation on a plurality of multiple level memory cells of a memory device. An example of applying such a pre-programming operation involves applying a series of voltage pulses to the plurality of multiple level memory cells, verifying a charge stored in the plurality of multiple level memory cells, and erasing the plurality of multiple level memory cells of the memory block based on a result from verifying the charge stored in the plurality of multiple level memory cells.

20 Claims, 7 Drawing Sheets

METHOD, APPARATUS, AND SYSTEM FOR ERASING MEMORY

RELATED APPLICATION

This application is a continuation of U.S. application Ser. No. 11/950,609, filed Dec. 5, 2007, now issued as U.S. Pat. No. 7,755,940, which is incorporated herein by reference in its entirety.

TECHNICAL FIELD

Various embodiments described herein relate generally to memory devices, such as those including flash memory devices.

BACKGROUND

Memory devices can be categorized in two broad areas: volatile and non-volatile. Volatile memory devices require power to maintain data, while non-volatile memories are capable of maintaining data in the absence of a power supply. An example of a non-volatile memory is the flash memory that stores data in a semiconductor device without the need for power to maintain the data in the chip. A flash memory device stores data in numerous memory cells, which are usually formed in a semiconductor chip. Each of the memory cells often has a metal-oxide semiconductor (MOS) transistor with two different transistor gates: a control gate and a floating gate. The control gate may be used to turn the transistor on and off to control access to the memory cell. The floating gate may be the place where data is stored in each memory cell.

The data stored in the floating gate may correspond to the amount of electrons or charge in the floating gate. For example, the data stored in the floating gate may represent a first state (e.g., logic zero or binary 0 value) when an excess number of electrons is present in the floating gate and a second state (e.g., logic one or binary 1 value) when the excess number of electrons is absent from the floating gate. The presence or absence of the excess number of electrons in the floating gate may be controlled by varying the number of electrons in the floating gate, for example, by either adding electrons to or extracting electrons from the floating gate.

A programming operation (which is sometimes referred to as a write operation) may be used to add electrons to the floating gate and an erase operation may be used to extract electrons from the floating gate. Data in the memory cells may be read in a read operation. Programming, read, and erase operations in a conventional flash memory device usually involve applying voltages to the memory cells, such as to the control gates of the transistors and to other device components within the flash memory device.

Flash memory may be built using NOR or NAND devices. NAND flash may be of single-level cell (SLC) or multiple-level cell (MLC) configuration. MLC NAND flash allows for a higher density memory device in comparison to SLC NAND flash because it allows the storage of comparatively more data in each memory cell (e.g., two bits of data instead of just a single bit of data).

A conventional flash memory device may go through many programming, read, and erase operations during its life. Improper control of the voltage applied to the memory cells during these operations may lead to inferior device performance, reliability, or both. Thus, there is a need for improved apparatus, systems, and methods to assist in, for example regulating the voltages applied to memory cells.

DETAILED DESCRIPTION

Figure 1:
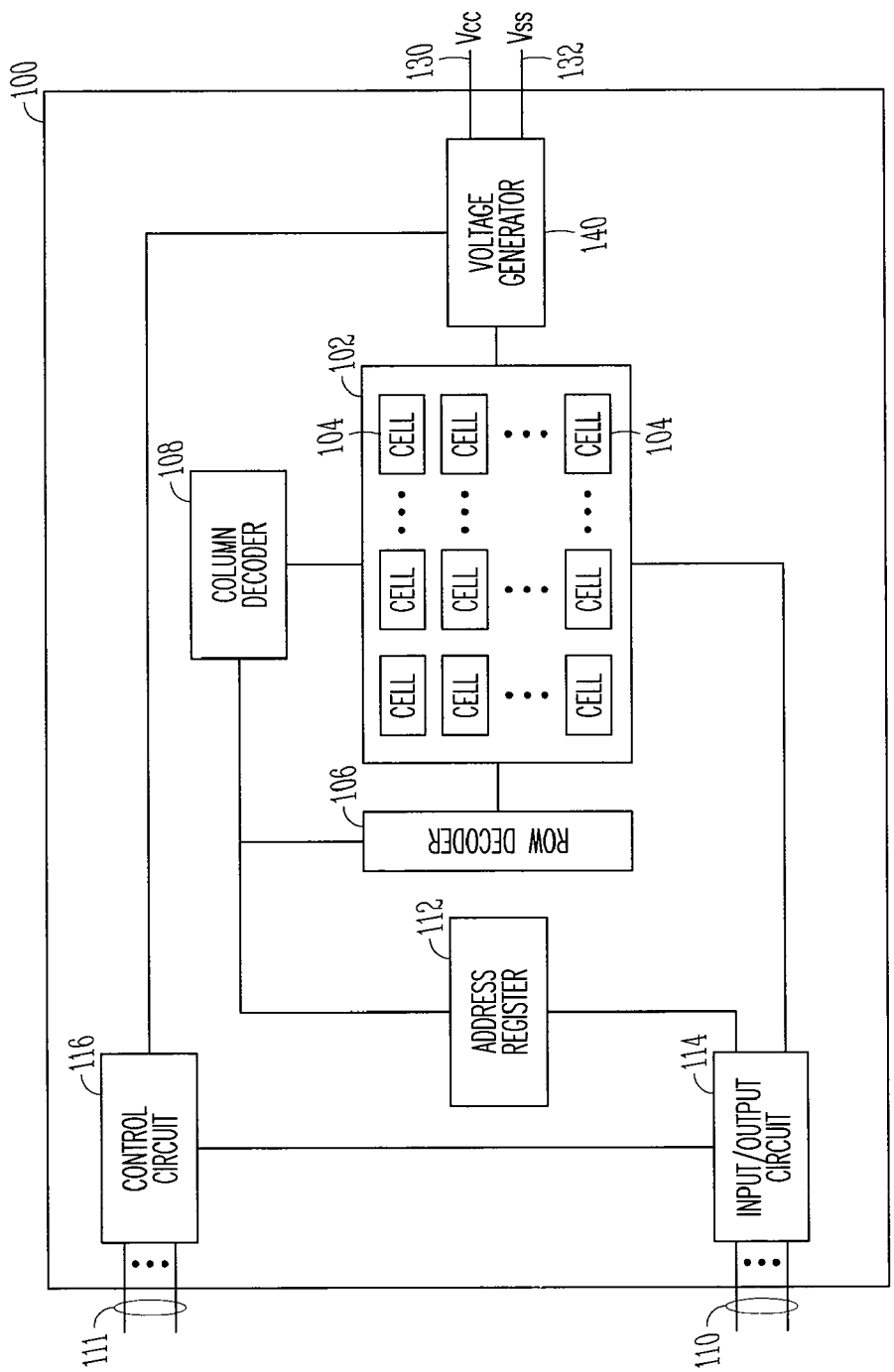
FIG. 1 illustrates a block diagram of a memory system, according to various embodiments of the invention.

A conventional flash memory comprises a memory array that is separated into blocks of memory cells (or simply "cells"). Each block of cells is logically arranged in a row and column fashion. Each cell includes a floating gate field-effect transistor capable of holding a charge. Each cell can be electrically programmed by charging the floating gate. The charge can be removed from the floating gate by an erase operation. Thus, the data in the cell is determined by the presence or absence of the charge in the floating gate.

In an MLC NAND flash memory cell, threshold voltage distribution can affect storage performance. That is, the ability to program data within a multiple level memory cell using voltages that fall within any one of the designated ranges of threshold voltages determines whether the programmed threshold voltage properly represents the data intended to be stored in the cell.

For example, in a four-bit per cell memory device wherein four bits of data may be stored in a single memory cell, 16 states are used. Each state is generally represented by a defined range of threshold voltages that may be programmed into a multiple level memory cell in order to represent the desired state. If the threshold voltages programmed into the memory cells are not in the intended range, the memory cells will not properly represent the data that was intended to be stored therein. In addition, even if the threshold voltage as originally programmed into the cells was within the proper range for the intended data, if the threshold voltage is not maintained within the proper range, the data stored in the memory cell may be corrupted or lost.

The state of a flash memory cell can be read (e.g., to verify the state) using a reference cell current. That is, a reference cell may be coupled to a sense amplifier circuit via a reference bit line. The cell to be read is also coupled to the sense amplifier circuit via a second bit line. A differential current between the bit lines is then detected and the programmed state of the cell is determined. For example, the reference cell may be programmed to an intermediate state such that it conducts about half the current conducted by a fully programmed memory cell, so that if the cell to be read is programmed, it conducts more current than the reference memory cell, and if the cell to be read is erased, it conducts less current than the reference cell.

In some embodiments, to program a memory cell, a high positive voltage such as approximately eighteen volts is applied to the control gate of the cell. In addition, a zero voltage is applied to the drain while a source voltage and a substrate voltage are maintained at approximately ground level. These conditions results in the inducement of Fowler-Nordheim tunneling injection in the channel region of the memory cell. These high-energy electrons travel through the thin gate oxide towards the positive voltage present on the control gate and collect on the floating gate. The electrons remain on the floating gate and function to increase the effective threshold voltage of the cell as compared to a cell that has not been programmed.

In various embodiments, memory cells are erased in blocks. This is achieved by placing a zero voltage on word lines coupled to the control gates of all cells in a block of cells and coupling well connection of the block to a $V_{erase}$ (power supply) voltage, such as about eighteen volts or higher for a period of time. Typically, this is done by using a single pulse or a series of pulses. Each pulse creates a field that removes electrons from the floating gates of the memory elements. The speed in which a cell is erased, e.g., the number of pulses needed to erase the cell, is dependent on many varying conditions including the pulse voltage level, length of the pulses, and temperature. Typically, the slowest cell in the block dictates the level of erasure of all cells in the block.

Although in conventional methods a soft program cycle can control the $V_t$ (threshold voltage) distribution of erased cells, it is not always sufficient. Additionally, the number of cells that are over-erased and recovered may be diminished with each over-erasure. Various embodiments described herein may address these challenges by providing an improved mechanism for erasing a block of flash memory.

FIG. 1 shows a block diagram of an apparatus including a memory device 100. Memory device 100 may include a memory array 102 with memory cells 104 logically arranged in rows and columns. Row decoder 106 and column decoder 108 may respond to an address register 112 and access memory cells 104 based on row address and column address signals on lines 110. A data input/output circuit 114 may transfer data between memory cells 104 and lines 110. A control circuit 116 may control operations of memory device 100 based on signals on lines 110 and 111.

Memory device 100 may comprise a flash memory device. In some embodiments, memory cells 104 may include flash memory cells arranged in a NAND flash memory arrangement. One skilled in the art will readily recognize that memory device 100 may include other parts, which are omitted from FIG. 1 to focus on the various embodiments described herein.

Memory device 100 may include nodes 130 and 132 to receive voltages $V_{cc}$ and $V_{ss}$, respectively. $V_{cc}$ may comprise the supply voltage for memory device 100, and $V_{ss}$ may comprise ground. Memory device 100 may also include a voltage generator 140. Voltage generator 140 and control circuit 116 may act separately or together to provide different voltages to memory array 102 or to influence the level of voltages present within the memory array 102 during various operations of memory device 100. The operations may include a programming operation to write data from lines 110 to memory cells 104, a read operation to read data from memory cells 104 to lines 110, and an erase operation to erase data from all or a portion of memory cells 104. In some embodiments, memory device 100 may include embodiments similar to or identical to those shown in FIG. 2 through FIG. 7 described below.

Figure 2:
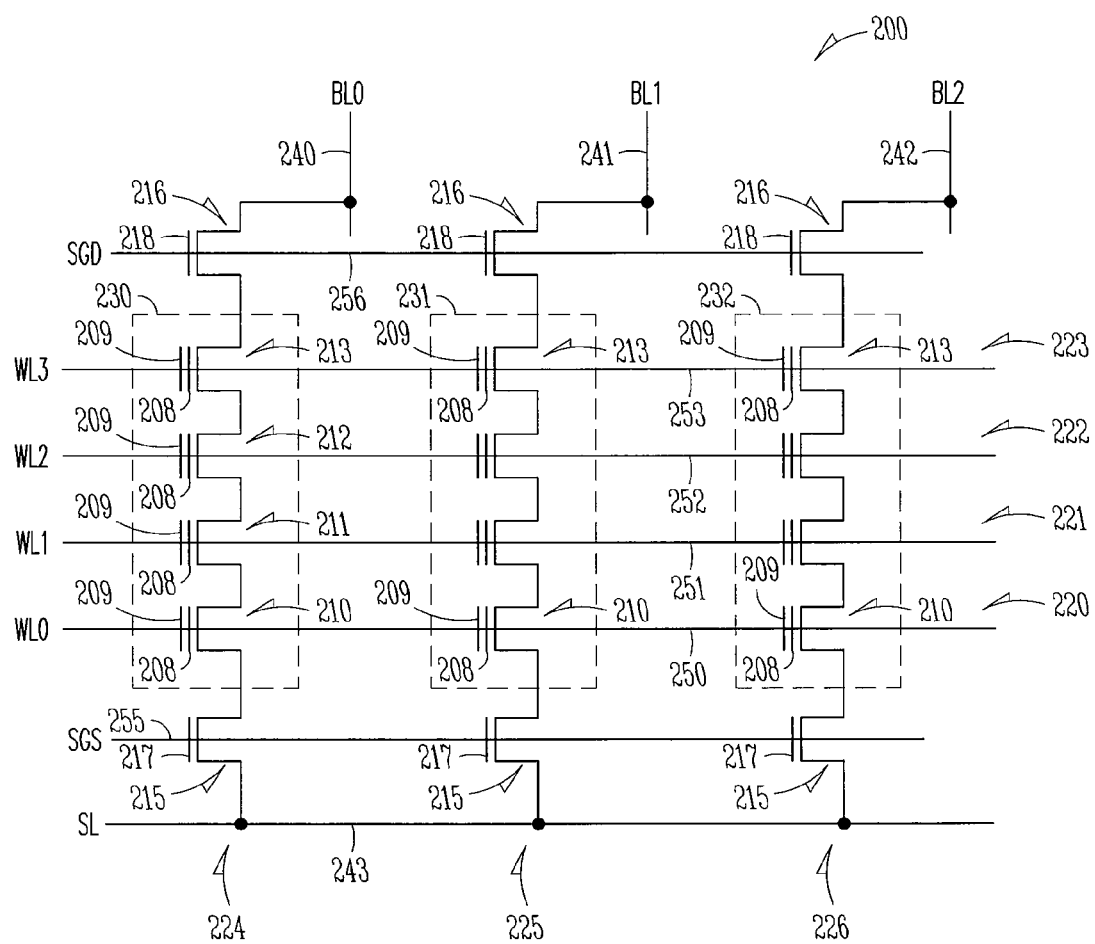
FIG. 2 illustrates a schematic diagram showing an array of memory cells, according to various embodiments of the invention.

FIG. 2 shows a partial schematic diagram of a memory device 200 according to an embodiment of the invention. Memory device 200 may be used in one embodiment as memory device 100 of FIG. 1. In FIG. 2, memory device 200 may include a number of memory cells 210, 211, 212, and 213 logically arranged in rows 220, 221, 222, and 223, and columns 224, 225, and 226. The memory cells in the same column 224, 225, and 226 may be connected in a series of memory cells sometimes referred to as a "string", such as strings 230, 231, and 232, respectively. Within each of strings 230, 231, and 232, memory cells 211 and 212 may be referred to as intermediate memory cells, memory cell 210 may be referred to as a first edge memory cell, and memory cell 213 may be referred to as a second edge memory cell. FIG. 2 shows an example where each string 230, 231, and 232 may include four memory cells 210, 211, 212, and 213. In some embodiments, the number of memory cells in each of strings 230, 231, and 232 may vary. For example, in some embodiments, the number of memory cells in each of strings 230, 231, and 232 may include more than two intermediate memory cells coupled between a first edge memory cell and a second edge memory cell.

In FIG. 2, memory device 200 includes select transistors 215, each being coupled between one of strings 230, 231, and 232 and a source line 243 having source line signal SL. Each select transistor 215 may include a gate 217 coupled to a select line 255. A select signal SGS on select line 255 may be used to activate (turn on) select transistors 215. Memory device 200 may also include select transistors 216, each being coupled between one of strings 230, 231, and 232 and one of bit lines 240, 241, and 242 having corresponding bit line signals BL0, BL1, and BL2, respectively.

Those of ordinary skill in the art will realize that memory device 200 does not show all the elements typically used in a memory array. The reduced number of elements has been used for reasons of clarity. For example, only three bit-lines are shown (BL0, BL1 and BL2) while the number of bit-lines employed typically depends on the memory density.

In FIG. 2, each select transistor 216 may include a gate 218 coupled to a select line 256. A select signal SGD on select line 256 may be used to activate select transistors 216.

Each of memory cells 210, 211, 212, and 213 may include a floating gate 208 and a control gate 209. Control gates 209 of memory cells (e.g., memory cells 210) in the same row (e.g., row 220) may be coupled to one of word lines 250, 251, 252, and 253. Word lines signals WL0, WL1, WL2, and WL3 on word lines 250, 251, 252, and 253 may be used to activate to memory cells 210, 211, 212, and 213. In FIG. 2, only four word lines are shown (WL0, WL1, WL2 and WL3) while the number of word lines employed typically depend on the memory density.

FIG. 2 shows each of select transistors 215 and 216 with a single gate (e.g., gate 217 or 218). In some embodiments, each of select transistors 215 and 216 may include two gates, similar or identical to those in each of the memory cells 210, 211, 212, and 213; in some embodiments, the two gates may be tied together (shorted) to act as a single gate transistor.

In FIG. 2, to program, read, or erase memory cells 210, 211, 212, and 213, appropriate voltages may be applied to select lines 255 and 256, word lines 250, 251, 252, and 253, bit lines 240, 241, and 242, and source line 243. In some embodiments, an erase operation of a memory device described herein may include an erase verify operation to verify whether the memory cells of the memory device are properly erased. During an erase operation of memory device 200, appropriate voltages may also be applied to a semiconductor substrate or to a well where memory cells 210, 211, 212, and 213 are formed.

Figure 3:
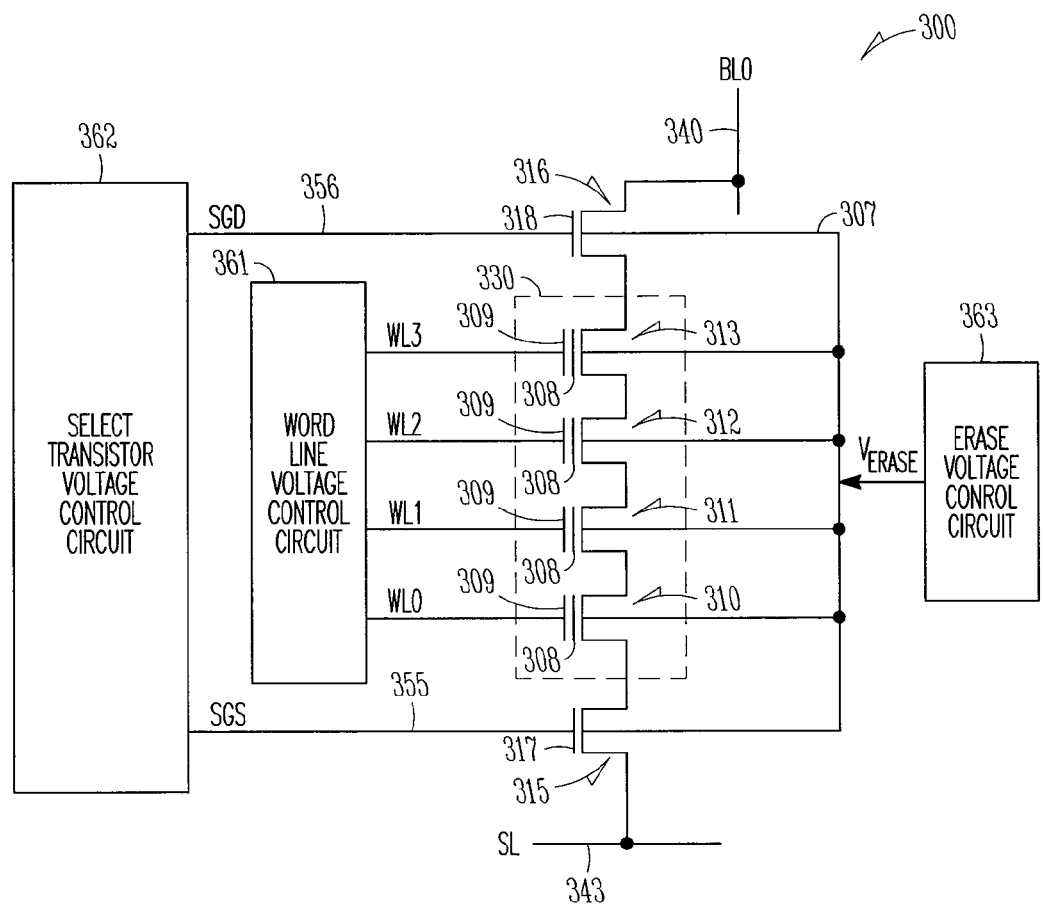
FIG. 3 illustrates a partial schematic diagram of a memory device, according to some embodiments of the invention.

FIG. 3 shows a partial schematic diagram of memory device 300 according an embodiment of the invention. In some embodiments, memory device 300 may be used as memory device 100 of FIG. 1.

In FIG. 3, memory device 300 includes a string 330 having memory cells 310, 311, 312, and 313 coupled to a bit line 340 (having bit line signal BL0) via a select transistor 316. String 330 may also couple to a source line 343 (having source line signal SL) via a select transistor 315. Control gates 309 of memory cells 310, 311, 312, and 313 may be coupled to receive word lines signals WL0, WL1, WL2, and WL3. Select transistor 315 may include a gate 317 coupled to a select line 355 to receive a select signal SGS. Select transistor 316 may include a gate 318 coupled to a select line 356 to receive a select signal SGD. Memory cells 310, 311, 312, and 313 and select transistors 315 and 316 may be formed on a well of a semiconductor substrate. In FIG. 3, the well (on which memory cells 310, 311, 312, and 313 and select transistors 315 and 316 may be formed) is schematically shown as well 307.

Memory device 300 may also include a word line voltage control circuit 361 to control the voltages of word lines WL0, WL1, WL2, and WL3. A select transistor voltage control circuit 362 may control the voltages of SGS and SGD during an erase operation. An erase voltage control circuit 363 may provide an erase voltage $V_{ERASE}$ and control the voltage of well 307 during an erase operation.

FIG. 3 shows an example where memory device 300 includes three separate circuits 361, 362, and 363. In some embodiments, circuits 361, 362, and 363 may be separated into more than three circuits, combined into fewer circuits (e.g., into a single circuit), or may form part of at least one of a voltage generator and a control circuit, such as voltage generator 140 and control circuit 116 of FIG. 1. FIG. 3 shows an example where memory device 300 may include one string 330 of memory cells. In some embodiments, memory device 300 may include numerous memory strings similar or identical to string 330.

In various embodiments, each memory cell may be programmed as a multiple level memory cell. Each cell's threshold voltage ($V_{th}$) determines the data that is stored in the cell. For example, in a single-bit-per-cell architecture, a $V_t$ of 1V might indicate a programmed cell while a $V_{th}$ of −1V might indicate an erased cell. The multilevel cells have more than two $V_{th}$ windows, each indicating a different state. Multiple level memory cells take advantage of the analog nature of a traditional flash cell by assigning a state (e.g., represented by a specific bit pattern) to a specific threshold voltage range stored on the cell. This technology permits the storage of, for example, two or more bits per cell, depending on the quantity of voltage ranges assigned to the cell.

For example, a memory cell storing two bits of data may be assigned four different threshold voltage distributions, each having a width of approximately 400 mV. In various embodiments, a separation of 0.3V to 0.5V is assigned between each threshold voltage distribution range as well. This separation zone between the threshold voltage distributions is established so that the multiple threshold voltage distributions do not overlap, causing logic errors. During verification, if the voltage stored on the cell is sensed to be within the 01 high threshold voltage distribution, then the cell is determined to be storing a 01. If the voltage is within the 00 second highest distribution, the cell is determined to be storing a 00. This continues for as many ranges (levels) as are used for the memory cell.

During a programming operation, the selected word line (WL) for the flash memory cell to be programmed may be supplied with a train of high voltage programming pulses. The high voltage programming pulses may start at about 16V and may increment in approximately 0.5V increments. In various embodiments, an approximately 10V non-incrementing, high voltage pulse is applied on the unselected WLs.

To inhibit selected cells from programming on the selected WLs, in one embodiment, the channel of the inhibited cell is decoupled from the bit line (BL) by applying approximately 2.5V on the BL. To program selected cells on the selected WL, the channel may be grounded to approximately 0V through the BL. The large potential formed between the channel and the WL is designed to cause the cell to program and the $V_t$ of the device will increase as higher programming pulses are applied.

In various embodiments, between every programming pulse, a verification phase is performed. During verification, the selected WL may be lowered to approximately 0V, the unselected WLs may be lowered to approximately 5V, and the states of the selected cells are sensed. If the cell is programmed to have a $V_t$ level such that the 0V on the WL does not induce the device to conduct, the device may be considered to be programmed. Otherwise, the cell is considered to be erased and the programming pulse height is increased by about 0.5V and applied to the selected WL again. This process is repeated until all selected cells to be programmed have indeed been programmed.

In various embodiments, erasing of memory blocks is usually done by placing a negative voltage on word lines coupled to the control gates of all the cells in a memory block of cells and coupling the source connection of the block to a $V_{cc}$ (power supply) such as about five volts or higher for a period of time. Typically, this is done by using a single pulse or a series of pulses. The speed at which a cell is erased is dependent on many varying conditions including pulse voltage level, length of the pulses, and temperature. Typically, the slowest cell in the block dictates the level of erasure of all the cells in the block. This can cause the other cells in the memory block to become over-erased.

To limit the amount of over-erased cells in a memory block of flash memory, an erase operation comprising a pre-program cycle, an erase cycle, and a soft program cycle, is performed. During a pre-program cycle, all the cells in a block are first programmed above a pre-determined level. This is done so that the floating gates of all the cells in the block start out with approximately the same amount of charge.

The erase cycle then applies an erase pulse to the memory block and verifies each cell row by row to determine if all the cells are in erased state. The erase cycle is repeated until all the cells have been verified as being erased. The soft programming cycle, or as it is sometimes referred to, the voltage ($V_t$) distribution cycle, then operates to check each column (bit line) in the memory block for current levels that would indicate if an over-erased memory cell is coupled to the bit line. If an over-erased cell is detected in a BL, a soft program (soft programming pulse) is systematically applied to the control gates of the cells coupled to the bit line until the current can no longer be detected.

Figure 4:
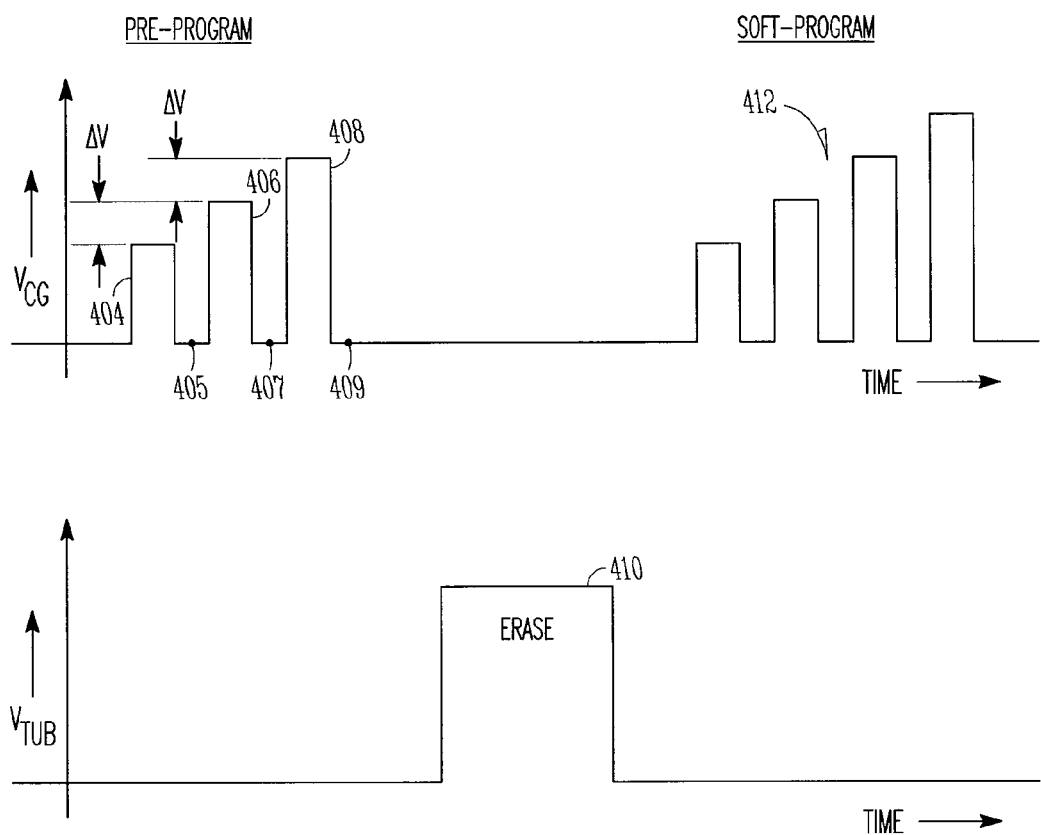
FIG. 4 is a diagram showing a distribution of threshold voltages provided during a pre-program cycle followed by an erase cycle and soft-program cycle in a multi-level NAND memory, according to various embodiments of the invention.

FIG. 4 is a diagram showing a distribution of threshold voltages provided during a pre-program cycle followed by an erase cycle and soft-program cycle in a multi-level NAND memory, according to various embodiments of the invention.

FIG. 4 shows a pre-program cycle including voltage pulses 404, 406, 408 and a verify operation. Gate voltage ($V_{CG}$) as shown in FIG. 4 is applied to the gate to inject electrons to the floating gate of each of the memory cells shown in FIGS. 1-3. In some embodiments, the difference in the voltage levels ($\Delta V$) of pulses 404 and 406 may be the same as the difference in the voltage levels of pulses 406 and 408. In some embodiments, in between the voltage pulses 404 and 406, a verify operation is performed at 405. Similarly, in between the voltage pulses 406 and 408, a verify operation is performed at instant 407. Additionally, following the voltage pulse 408, a verify operation is performed at 409. In some embodiments, the verify operation includes reading the plurality of memory cells in a memory block and determining the charge stored in the plurality of memory cells. In some embodiments, the verify operation includes determining whether the charge stored in the plurality of memory cells of the memory block is above a determined value.

Following the pre-program cycle, an erase pulse 410 is provided to the memory cells during an erase cycle. Following which, a soft-program cycle 412 is applied to the memory cells.

Figure 5:
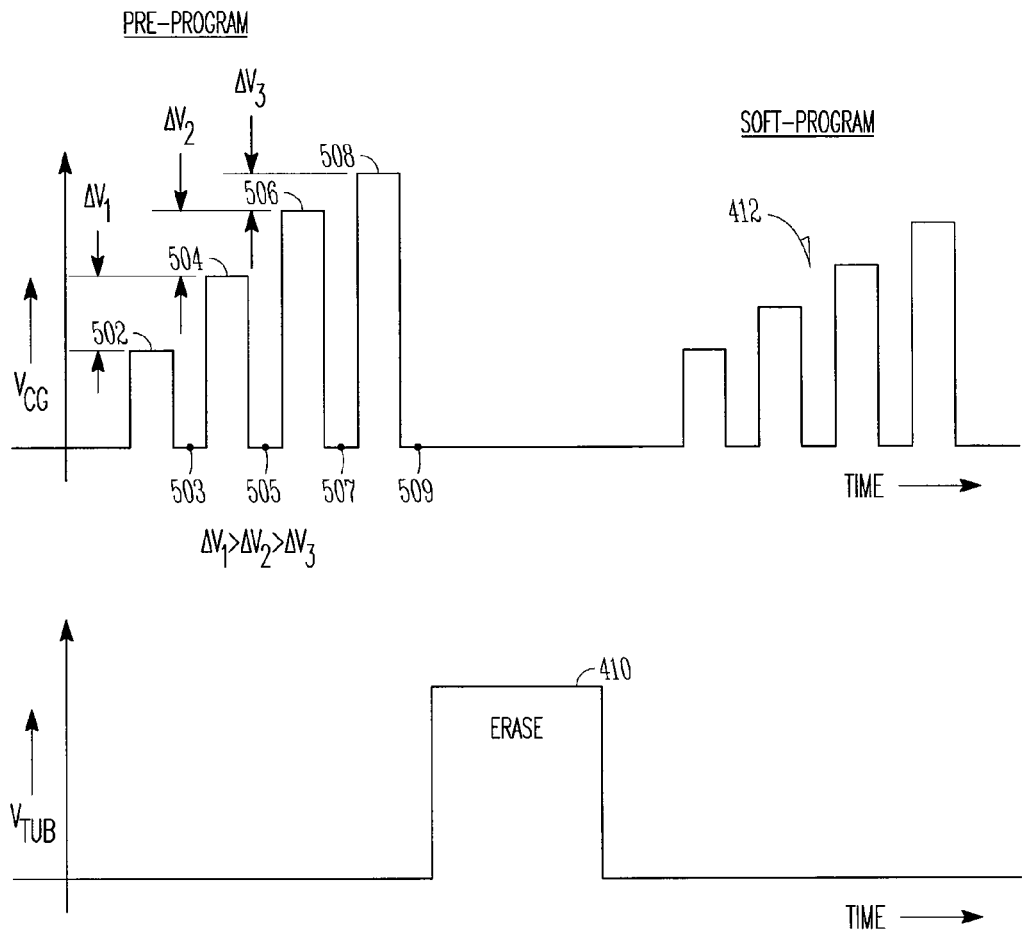
FIG. 5 is a diagram showing an alternate distribution of threshold voltages provided during a pre-program cycle followed by an erase cycle and soft-program cycle in a multi-level NAND memory, according to various embodiments of the invention.

FIG. 5 is a diagram showing an alternate distribution of threshold voltages provided during pre-program cycle followed by an erase cycle and soft-program cycle in a multi-level NAND memory, according to various embodiments of the invention. FIG. 5 shows a pre-program cycle including voltage pulses 502, 504, 506, and 508. Gate voltage ($V_{CG}$) as shown in FIG. 5 is applied to the gate to inject electrons to the floating gate of each of the memory cells shown in FIGS. 1-3. In some embodiments, the difference in the voltage levels ($\Delta V_1$) of pulses 504 and 502 may be greater than the difference in the voltage levels ($\Delta V_2$) of pulses 506 and 504. Additionally, the difference in the voltage levels ($\Delta V_2$) of pulses 506 and 504 may be greater than the difference in the voltage levels ($\Delta V_3$) of pulses 508 and 506. Following the pre-program cycle, an erase pulse 410 similar to that shown in FIG. 4 is provided to the memory cells during an erase cycle. Following which, a soft-program cycle 412 is applied to the memory cells.

In some embodiments, in between the voltage pulses 502 and 504, a verify operation is performed at 503. Similarly, in between the voltage pulses 504 and 506, a verify operation is performed at 505. Additionally, in between the voltage pulses 506 and 508, a verify operation is performed at 507. Furthermore, following the voltage pulse 508, a verify operation is performed at 509. In some embodiments, the verify operation includes reading the plurality of memory cells in a memory block and determining the charge stored in the plurality of memory cells. In some embodiments, the verify operation includes determining whether the charge stored in the plurality of memory cells of the memory block is above a pre-determined value.

Figure 6:
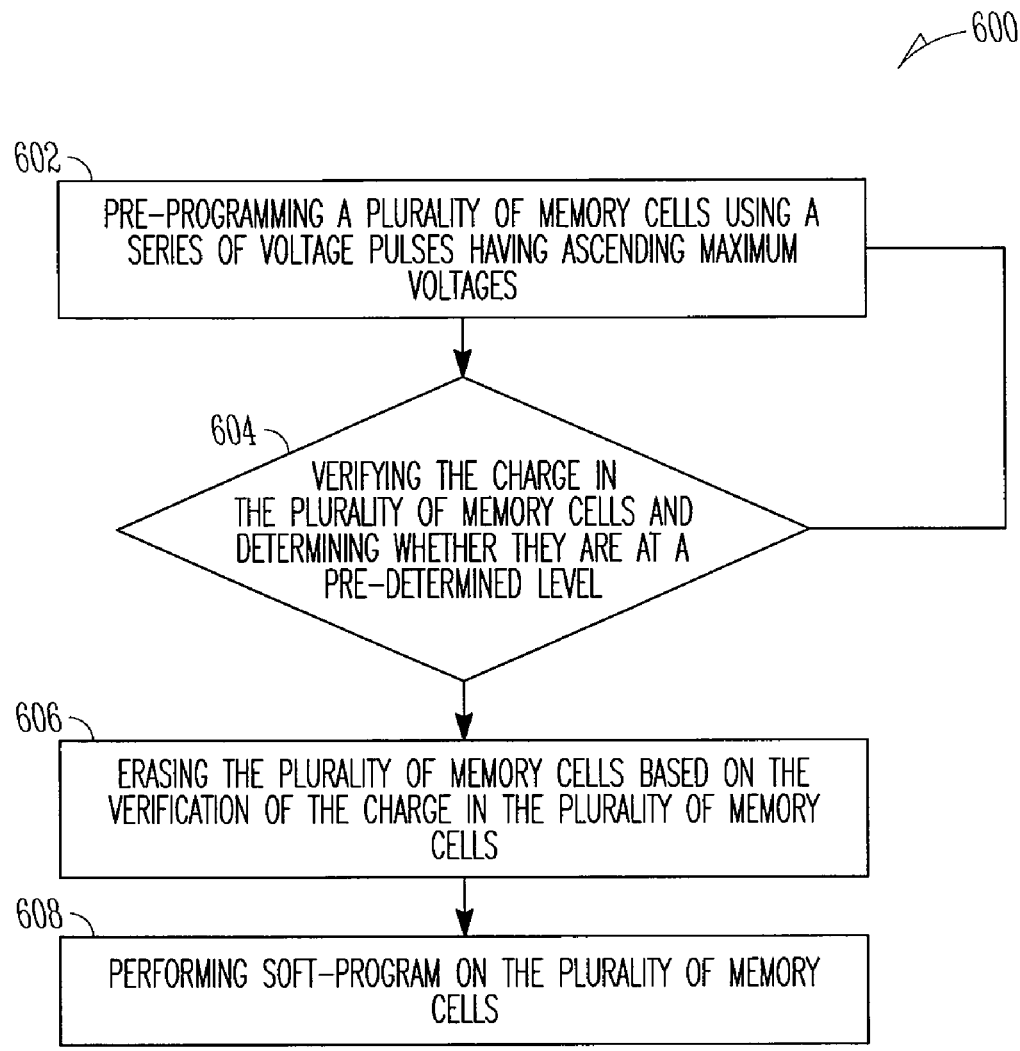
FIG. 6 is a flow diagram showing a method of erasing flash memory, according to various embodiments of the invention.

FIG. 6 is a flow diagram showing a method 600 of erasing memory cells in a multi-level flash memory, according to various embodiments of the invention. In some embodiments, method 600 may be used in a memory device such as memory device 100, 200, or 300 described in FIG. 1 through FIG. 3. Thus, in some embodiments, the circuit elements, such as the memory cells, used in method 600 may include the circuit elements of the embodiments described above with reference to FIG. 1 through FIG. 3.

At 602, method 600 of FIG. 6 comprises a pre-programming operation that includes applying a series of voltage pulses to a plurality of multiple level memory cells in a memory block with each voltage pulse having a greater peak voltage than the preceding pulse. In particular, the voltage pulses may be provided so as to affect the floating gate. Each pulse creates a field that injects electrons to the floating gates of the memory elements.

At 604, method 600 comprises verifying the charge in the plurality of memory cells and determining whether they are at a predetermined level. In some embodiments, if the verification is unsuccessful, the method goes back to 602 and continues to perform pre-programming of the memory cell. In some embodiments, when the verification is successful, the method proceeds to 606. In some embodiments, verifying the charge stored in the plurality of memory cells includes verifying the charge stored in the plurality of memory cells are substantially uniform. In some embodiments, the verify operation includes reading the plurality of memory cells in a memory block and determining the charge stored in the plurality of memory cells. In some embodiments, the verify operation includes determining whether the charge stored in the plurality of memory cells of the memory block is above a determined value.

At 606, method 600 includes performing an erase cycle on the memory cells. The erase cycle applies an erase pulse to the memory block and, in some embodiments, verifies each cell row by row to determine if all the cells are in erased state. The erase cycle is repeated until all the cells have been verified as being erased.

At 608, method 600 performs a soft-programming cycle on the memory cells.

Figure 7:
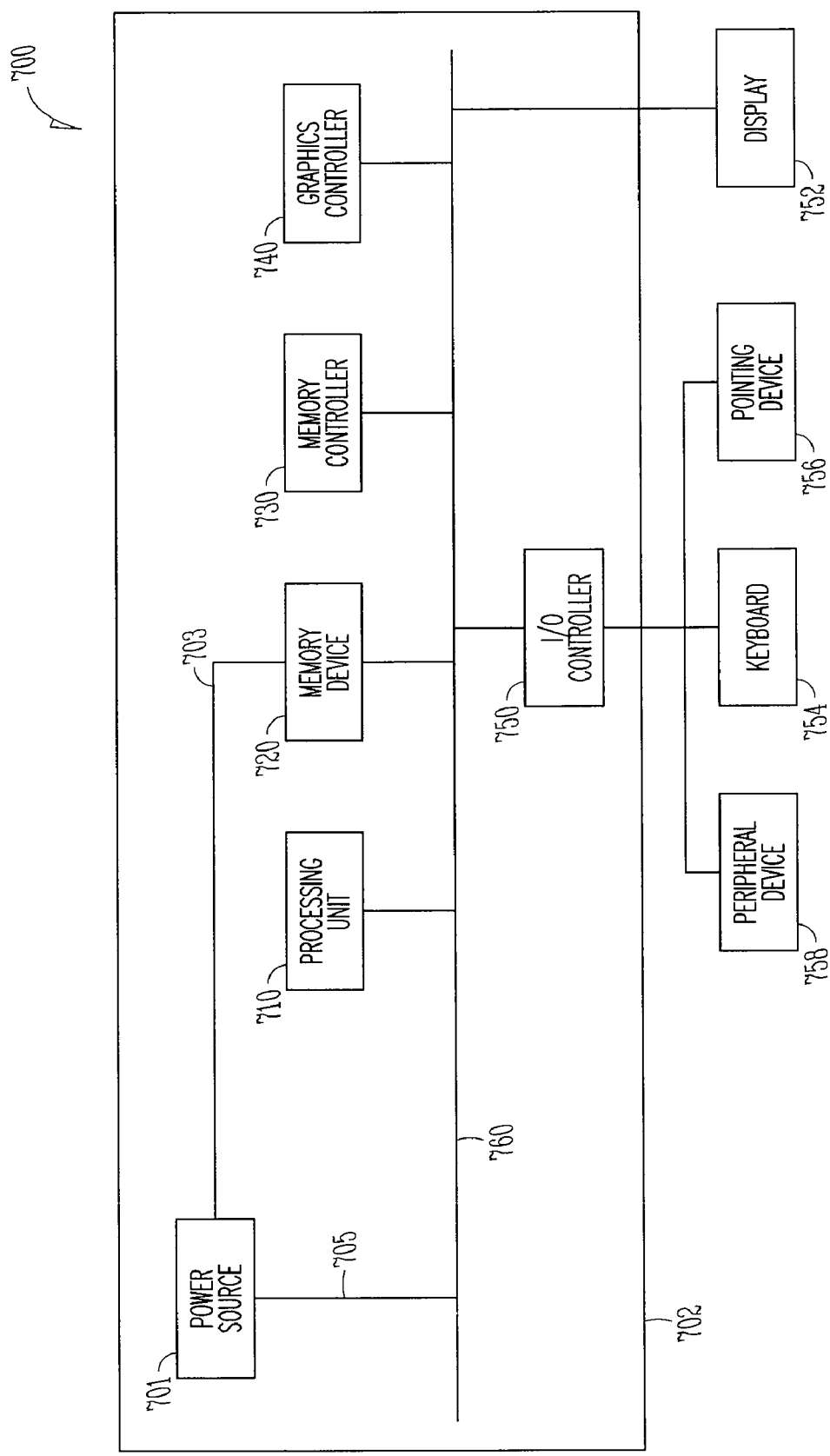
FIG. 7 shows a block diagram of a system including a memory device, according to various embodiments of the invention.

FIG. 7 shows a block diagram of a system 700 according to an embodiment of the invention. System 700 may include a processing unit 710, a memory device 720, a memory controller 730, a graphics controller 740, an input and output (I/O) controller 750, a display 752, a keyboard 754, a pointing device 756, a peripheral device 758, and a bus 760. System 700 may also include a circuit board 702 on which some components of system 700 may be located, as shown in FIG. 7. Circuit board 702 may include terminals 703 and 705 coupled to a power source 701 to provide power or voltage to the components of system 700, including memory device 720. Power source 701 may be provided by alternating current to direct current (AC to DC) converting circuitry, a battery, or others. Memory device 720 may comprise a volatile memory device, a non-volatile memory device, or a combination of both. For example, memory device 720 may comprise a dynamic random access memory (DRAM) device, a static random access memory (SRAM) device, a flash memory device, or a combination of these memory devices. I/O controller 750 may include a communication module for wired or wireless communication. In some embodiments, the number of components of system 700 may vary.

Processing unit 710 may process data transferred to and from other components via bus 760. Processing unit 710 may include a general-purpose processor or an application specific integrated circuit (ASIC). Processing unit 710 may comprise a single-core processing unit or a multiple-core processing unit.

In some embodiments, memory device 720 may include one or more embodiments of memory devices 100, 200, and 400 described above with reference to FIG. 1 through FIG. 5.

System 700 may be included in computers (e.g., desktops, laptops, hand-held devices, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape players, compact disc players, DVD players, video cassette recorders, DVD recorders, camcorders, digital cameras, MP3 (Motion Picture Experts Group, Audio Layer 3) players, video games, watches, etc., and the like.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein, individually or collectively, by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

Voltage magnitudes for "low" logic signals and "high" logic signals are normally not defined since they can have a variety of relative values including negative voltages and positive voltages. "High" and "low" logic signals are defined only by their relationship to one another in representing binary values. Typically, a "high" logic signal has a voltage level or potential higher than a "low" logic signal, or the "low" signal may have a different polarity or negative polarity than the "high" signal. As those skilled in the art well understand, in some logic systems, a "high" logic value may even be represented by a ground potential when the relative "low" logic value is represented by a negative voltage potential in reference to ground.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

CONCLUSION

Methods, apparatus, and systems have been disclosed for application to multiple level flash memory cells. Various embodiments include pre-programming a plurality of memory level flash memory cells, wherein the pre-programming operation includes applying a series of voltage pulses to the plurality of memory cells. Various embodiments include reading one or more memory cells in a memory block and determining the amount of charge stored in the cells. Various embodiments include verifying the charge stored in the cells.

One or more embodiments provides an improved process for erasing a block of flash memory. Furthermore, various embodiments described herein can operate to protect the integrity of flash memory cells and reduce the number of over-erased memory cells, which in turn may reduce the number of erased cells to be recovered.

What is claimed is:

1. A method comprising:
   programming memory cells in a memory block of a memory array above a pre-determined level, the memory array being separated into memory blocks including the memory block, each of the memory blocks having a plurality of memory cells, each memory cell being a multiple level memory cell;
   applying an erase pulse to the memory block;
   after applying the erase pulse, verifying each memory cell of the memory block to determine if all the memory cells in the memory block are in an erased state; and
   checking to determine if there is an over-erased memory cell in the memory block.

2. The method of claim 1, wherein programming memory cells in the memory block includes configuring floating gates of the memory cells in the memory block with approximately equal amounts of charge.

3. The method of claim 1, wherein the method includes repeating the applying of the erase pulse until each of the memory cells of the memory block have been verified as being erased.

4. The method of claim 1, wherein checking to determine if there is an over-erased memory cell includes checking each bit line in the memory block for a current level indicative of an over-erased state.

5. The method of claim 1, wherein the method includes:
   determining that there is an over-erased memory cell coupled to a bit line in the memory block; and
   applying one or more programming pulses to control gates of memory cells coupled to the bit line until a current level associated with the bit line is such as to be essentially no longer detected.

6. The method of claim 1, wherein verifying each memory cell includes verifying each memory cell on a row by row basis.

7. The method of claim 1, wherein each multiple level memory cell is a four-bit per cell memory cell.

8. The method of claim 1, wherein programming memory cells in a memory block includes:
   applying a series of voltage pulses to the memory cells;
   verifying charge in the memory cells to determine whether each of the memory cells is above the pre-determined level; and
   when the verification is unsuccessful, applying another series of voltage pulses.

9. The method of claim 1, wherein programming memory cells in the memory block includes applying a series of voltage pulses having ascending maximum peak voltages to the memory cells.

10. A memory device comprising:
    a memory array separated into memory blocks, each memory block having a plurality of memory cells, each memory cell being a multiple level memory cell;
    a circuit having one or more voltage generators arranged to generate a signal to program the memory cells in a memory block of the memory array above a pre-determined level and to apply an erase pulse to the memory block;

a sensing circuit arranged to check current levels in each bit line in the memory block, after the erase pulse is applied, to determine if there is an over-erased memory cell in the memory block; and a soft program circuit arranged to apply a signal to control gates of the memory cells coupled to a bit line to which a determined over-erased memory cell is coupled.

11. The memory device of claim 10, wherein the circuit having one or more voltage generators is operable to generate a series of voltage pulses having ascending maximum peak voltages to program the memory cells in the memory block above the pre-determined level.

12. The memory device of claim 10, wherein the soft program circuit is operable to apply the signal to control gates of the memory cells coupled to the bit line to which the determined over-erased memory cell is coupled until the current level can no longer be detected.

13. The memory device of claim 10, wherein each multiple level memory cell is a four-bit per cell memory cell.

14. The memory device of claim 10, wherein the circuit having one or more voltage generators, the sensing circuit, and the soft program circuit are integrated in a common control circuit.

15. A memory device comprising:
a memory array separated into memory blocks, each of the memory blocks having a plurality of memory cells, each of the memory cells being a multiple level memory cell;

a circuit arranged to control an erase operation on a memory block, the erase operation comprising a pre-program cycle, an erase cycle, and a soft program cycle such that the circuit is operable to apply a series of pulses, having ascending voltage levels, to the memory cells of the memory block during the pre-program cycle and to erase the memory cells based on an outcome of the pre-program cycle.

16. The memory device of claim 15, wherein the circuit is operable to perform a verify operation during the pre-program cycle.

17. The memory device of claim 16, wherein the circuit is operable to perform the verify operation between each pulse of the series of pulses.

18. The memory device of claim 16, wherein the circuit is operable to read the memory cells in the memory block and to determine charge stored in the memory cells, during the verify operation.

19. The memory device of claim 16, wherein the circuit is operable to read the memory cells in the memory block and to determine whether charge stored in the memory cells of the memory block is above a determined value, during the verify operation.

20. The memory device of claim 16, wherein the circuit is operable to perform a verify operation during the erase cycle to determine if all of the memory cells are in an erased state.

* * * * *